(12) United States Patent
Bao et al.

(10) Patent No.: US 11,189,616 B2
(45) Date of Patent: Nov. 30, 2021

(54) MULTI-THRESHOLD VOLTAGE NON-PLANAR COMPLEMENTARY METAL-OXTDE-SEMICONDUCTOR DEVICES

(71) Applicant: INTERNATIONAL BUSINESS MACHINES CORPORATION, Armonk, NY (US)

(72) Inventors: Ruqiang Bao, Niskayuna, NY (US); Koji Watanabe, Rensselaer, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 23 days.

(21) Appl. No.: 16/573,348

(22) Filed: Sep. 17, 2019

(65) Prior Publication Data
US 2021/0082915 A1    Mar. 18, 2021

(51) Int. Cl.
*H01L 27/092* (2006.01)
*H01L 29/78* (2006.01)
*H01L 29/66* (2006.01)
*H01L 21/02* (2006.01)
*H01L 29/06* (2006.01)

(52) U.S. Cl.
CPC .... *H01L 27/0922* (2013.01); *H01L 21/02178* (2013.01); *H01L 27/0924* (2013.01); *H01L 29/0665* (2013.01); *H01L 29/66666* (2013.01); *H01L 29/66795* (2013.01); *H01L 29/785* (2013.01); *H01L 29/7827* (2013.01)

(58) Field of Classification Search
CPC ............. H01L 27/0922; H01L 27/0924; H01L 29/0665
See application file for complete search history.

(56) References Cited

U.S. PATENT DOCUMENTS

| | | |
|---|---|---|
| 7,105,889 B2 | 9/2006 | Bojarczuk, Jr. et al. |
| 7,242,055 B2 | 7/2007 | Bojarczuk, Jr. et al. |
| 7,482,232 B2 | 1/2009 | Appenzeller et al. |
| 8,383,502 B2 | 2/2013 | Chen et al. |
| 9,263,344 B2 | 2/2016 | Ando et al. |

(Continued)

OTHER PUBLICATIONS

Linder et al., "Gate First PFET Poly-Si/TiN/Al2O3 Gate Stacks with Inversion Thicknesses Less than 15Å for High Performance or Low Power CMOS Applications", Extended Abstracts of the 2007 International Conference on Solid State Devices and Materials, May 2007, pp. 16-17.

(Continued)

*Primary Examiner* — Marc Anthony Armand
(74) *Attorney, Agent, or Firm* — Tutunjian & Bitetto, P.C.; Randall Bluestone

(57) ABSTRACT

A device is provided. The device includes an interfacial layer on a semiconductor device channel. The device further includes a dipole layer on the interfacial layer, and a gate dielectric layer on the dipole layer. The device further includes a first work function layer associated with a first field effect transistor device; and a second work function layer associated with a second field effect transistor device, such that the first field effect transistor device and second field effect transistor device each have a different threshold voltage than a first field effect transistor device and second field effect transistor device without a dipole layer.

17 Claims, 12 Drawing Sheets

(56) References Cited

U.S. PATENT DOCUMENTS

| | | |
|---|---|---|
| 9,847,401 B2 | 12/2017 | Chiu et al. |
| 9,947,528 B2 | 4/2018 | Zhu et al. |
| 10,276,676 B1* | 4/2019 | Liang ................ H01L 29/42356 |
| 2010/0276753 A1 | 11/2010 | Greene et al. |
| 2010/0320545 A1 | 12/2010 | Jagannathan et al. |
| 2015/0255277 A1* | 9/2015 | Tong ..................... H01L 21/324 |
| | | 257/288 |
| 2016/0093711 A1* | 3/2016 | Hong ................... H01L 29/517 |
| | | 257/407 |
| 2017/0110375 A1* | 4/2017 | Bao ................ H01L 21/823842 |
| 2017/0162383 A1* | 6/2017 | Li ......................... H01L 21/324 |
| 2020/0020688 A1* | 1/2020 | Badaroglu .......... H01L 21/0273 |
| 2020/0135915 A1* | 4/2020 | Savant .............. H01L 21/02153 |

OTHER PUBLICATIONS

Ramanan et al., "ALD gate dielectrics for improved threshold voltage stability in AlGaN/GaN MOS-HFETs for power applications", IOP Publishing, Semiconductor Science and Technology, vol. 30, Nov. 2015, pp. 1-8.

\* cited by examiner

MULTI-THRESHOLD VOLTAGE NON-PLANAR COMPLEMENTARY METAL-OXTDE-SEMICONDUCTOR DEVICES

BACKGROUND

The present invention generally relates to multi-threshold voltage complementary metal-oxide-semiconductor (CMOS) devices, and more particularly to multi-threshold voltage non-planar CMOS devices.

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate). Depending on the doping of the source and drain, an n-type FET (NFET) or a p-type FET (PFET) can be formed. Two FETs also can be coupled to form a complementary metal oxide semiconductor (CMOS) device, where a p-type MOSFET and n-type MOSFET are coupled together.

SUMMARY

In accordance with an embodiment of the present invention, a device is provided. The device includes an interfacial layer on a semiconductor device channel. The device further includes a dipole layer on the interfacial layer, and a gate dielectric layer on the dipole layer. The device further includes a first work function layer associated with a first field effect transistor device; and a second work function layer associated with a second field effect transistor device, such that the first field effect transistor device and second field effect transistor device each have a different threshold voltage than a first field effect transistor device and second field effect transistor device without a dipole layer.

In accordance with another embodiment of the present invention, a plurality of field effect transistor devices each having a gate structure is provided. The plurality of field effect transistor devices each having a gate structure includes an interfacial layer on each semiconductor device channel of the plurality of field effect transistor devices, wherein a first set of the plurality of field effect transistor devices are n-type field effect transistor devices and a second set of field effect transistor devices are p-type field effect transistor devices. The plurality of field effect transistor devices each having a gate structure further includes a dipole layer on the interfacial layer on each of a subset of the plurality of field effect transistor devices, wherein at least one of the dipole layers is on at least one of the n-type field effect transistor devices and at least another one of the dipole layers is on at least one of the p-type field effect transistor devices. The plurality of field effect transistor devices each having a gate structure further includes a gate dielectric layer on each of the interfacial layers, a first work function layer on the gate dielectric layer on the first set of the plurality of field effect transistor devices, and a second work function layer on the gate dielectric layer on the second set of the plurality of field effect transistor devices, wherein the first work function layer is a work function material (WFM) different from the second work function layer.

In accordance with yet another embodiment of the present invention, a method of fabricating a plurality of field effect transistor devices each having a gate structure is provided. The method includes forming a plurality of semiconductor device channels on a substrate, and forming an interfacial layer on each of the plurality of semiconductor device channels. The method further includes forming a gate dielectric layer on the interfacial layers, and forming a conversion layer segment on the gate dielectric layer on a subset of the plurality of semiconductor device channels. The method further includes forming a capping layer on each of the plurality of semiconductor device channels, forming a cover layer on the plurality of semiconductor device channels, and heat treating the conversion layer segments and plurality of semiconductor device channels to form a dipole layer between the interfacial layer and gate dielectric layer on the subset of the plurality of semiconductor device channels.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide a method of modifying the threshold voltages of non-planar transistor devices, which can include vertical fin transistor devices and nanosheet transistor devices. The threshold voltages can be modified for an n-type transistor device and a p-type transistor device on neighboring regions of a substrate using conversion layer segments selectively formed on predetermined transistor devices. The conversion layer segments can be formed on a subset of the n-type field effect transistor devices and a subset of p-type field effect transistor devices to shift the threshold voltages of each of the devices in a predetermined direction. The conversion layer segments can be transformed into dipole layers that change the threshold voltages of the n-type and p-type devices.

Embodiments of the present invention provide a set of non-planar transistor devices having different threshold voltages from each other by modifying selected devices using conversion layer segments that is transformed into a dipole layer. The non-planar transistor devices can include vertical transport field effect transistor (VTFET) devices, horizontal transport fin field effect transistor (HT FinFET) devices, and/or nanosheet type field effect transistor devices.

Embodiments of the present invention provide a method of forming non-planar transistor devices having different threshold voltages using an aluminum containing conversion layer segments that can affect the dipole properties of a gate dielectric layer forming a gate structure on the non-planar transistor devices.

Embodiments of the present invention provide a set of non-planar transistor devices having different threshold voltages having dipole layers on a subset of the devices to shift the threshold voltage. The aluminum-containing dipole layers can be on one or more n-type FETs and/or one or more p-type FETs to shift the threshold voltage of the FET device(s) from a normal or regular value.

Exemplary applications/uses to which the present invention can be applied include, but are not limited to: FinFET like double gate FinFET, trigate FinFET, horizontal gate all around (GAA) FETs like nanowire, omega FETs, and nanosheet, and vertical GAA FETs, for example, vertical transport FETs (VTFETs).

It is to be understood that aspects of the present invention will be described in terms of a given illustrative architecture; however, other architectures, structures, substrate materials and process features and steps can be varied within the scope of aspects of the present invention.

Figure 1:
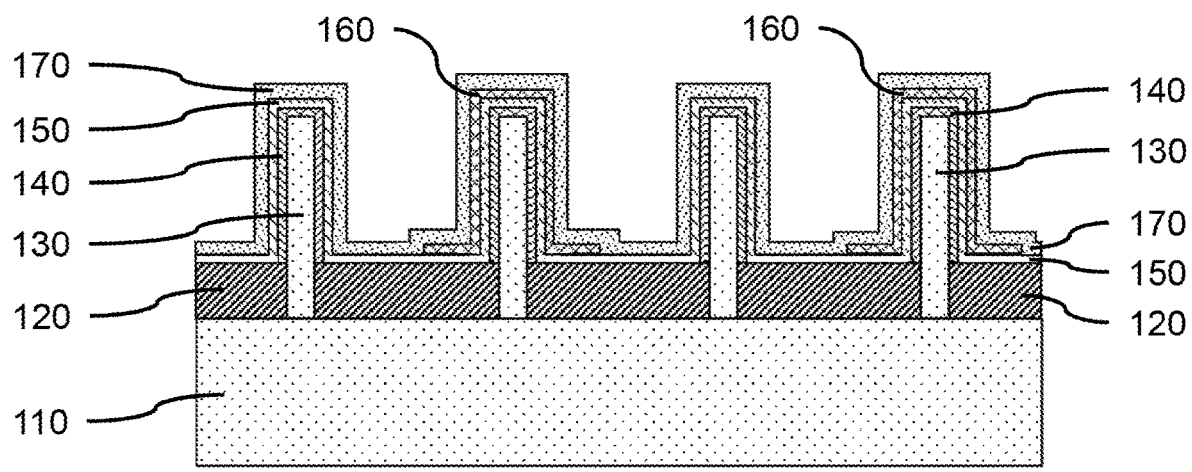
FIG. 1 is a cross-sectional side view showing a plurality of vertical fins on a substrate with conversion layer segments on a subset of the vertical fins, and a gate dielectric layer and capping layer on each of the vertical fins, in accordance with an embodiment of the present invention.

Referring now to the drawings in which like numerals represent the same or similar elements and initially to FIG. 1, a cross-sectional side view of a plurality of vertical fins on a substrate with conversion layer segments on a subset of the vertical fins, and a gate dielectric layer and capping layer on each of the vertical fins is shown, in accordance with an embodiment of the present invention.

In one or more embodiments, a substrate 110 can be a semiconductor substrate or a semiconductor-on-insulator (SeOI) substrate, for example, a silicon-on-insulator (SOI) substrate or a silicon-germanium-on-insulator (SGOI) substrate. The substrate 110 can include a semiconductor, including silicon (Si) silicon-germanium (SiGe), germanium (Ge) or silicon carbide (SiC).

In various embodiments, the substrate can be a single crystal semiconductor, where the substrate can be a single crystal semiconductor wafer.

In one or more embodiments, a plurality of vertical fins 130 can be formed on the substrate 110, where the vertical fins can be formed by a sidewall image transfer process or a direct write process. In various embodiments, the sidewall image transfer (SIT) processes can be, for example, self-aligned single patterning (SASP), self-aligned double patterning (SADP), self-aligned triple patterning (SATP), or self-aligned quadruple patterning (SAQP). Direct write processes can utilize electron beam (EB), extreme ultraviolet (EUV), or x-ray lithography processes.

In one or more embodiments, an isolation layer 120 can be formed on the substrate 110, where the isolation layer 120 can be formed by a blanket deposition, for example, chemical vapor deposition (CVD) or plasma enhanced CVD (PECVD), and etched back to a predetermined height, or by a directional deposition, for example, high density plasma (HDP) or gas cluster ion beam (GCIB). The isolation layer 120 can cover a lower portion of the vertical fins 130 up to the thickness of the isolation layer. An upper portion of the vertical fins 130 above the isolation layer 120 can be exposed.

In various embodiments, the isolation layer 120 can be a dielectric material, including, but not limited to, silicon oxide (SiO), silicon nitride (SiN), silicon oxynitride (SiON), silicon carbonitride (SiCN), silicon boronitride (SiBN), silicon borocarbide (SiBC), silicon boro carbonitride (SiBCN), or combinations thereof.

In various embodiments, the isolation layer 120 can have a thickness in a range of about 10 nm to about 100 nm, or about 30 nm to about 60 nm, or about 10 nm to about 50 nm, although other thicknesses are also contemplated.

In one or more embodiments, an interfacial layer 140 can be formed on each of the vertical fins 130, where the interfacial layer 140 can be a silicon oxide layer (SiO) formed on the exposed surfaces of the vertical fins 130. The interfacial layer 140 can be formed by a wet chemical reaction using ozone (O3) or a dry process, for example, a thermal oxide. In various embodiments, the interfacial layer 140 can be silicon dioxide ($SiO_2$).

In various embodiments, the interfacial layer 140 can have a thickness in a range of about 0.3 nanometers (nm) to about 3 nm, or about 0.5 nm to about 1.5 nm, although other thicknesses are also contemplated.

In one or more embodiments, a gate dielectric layer 150 can be formed on the isolation layer 120 and the interfacial layer(s) 140, where the gate dielectric layer 150 can be formed by a conformal deposition, for example, atomic layer deposition (ALD) or plasma enhanced ALD (PEALD). The gate dielectric layer 150 can be formed on the isolation layer 120 and on the interfacial layer(s) 140 on the vertical fins 130, where the portion of the vertical fin 130 covered by the gate dielectric layer 150 can form a device channel.

In various embodiments, the gate dielectric layer 150 can be a dielectric material, including, but not limited to silicon nitride (SiN), a high-K dielectric material, or a combination thereof. In various embodiments, the high-K dielectric material can be metal oxides, for example, hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), and lead zinc niobate (PbZnNbO). The high-k material may further include dopants such as lanthanum, aluminum, magnesium, or combinations thereof.

In one or more embodiments, a conversion layer can be formed on a subset of the vertical fins, where the conversion layer can be formed by a conformal deposition (e.g., ALD, PEALD), where the conversion layer can be formed on the exposed surfaces of the gate dielectric layer 150. The conversion layer can be formed on portions of the gate dielectric layer 150 for predetermined transistor devices using masking techniques to expose the predetermined transistor devices, while covering other vertical fins. The conversion layer can be patterned using lithographic techniques and etching to form conversion layer segments 160 on a subset of the vertical fins 130 and portions of the isolation layer 120.

In various embodiments, the conversion layer segments 160 can be an aluminum containing material, including, but not limited to, aluminum oxide (AlO), titanium-aluminum alloys (TiAl), aluminum metal (Al), and combinations thereof.

In various embodiments, the conversion layer and conversion layer segments 160 can have a thickness in a range of about 0.1 nanometer (nm) to about 1 nm, or about 0.2 nm to about 0.5 nm, although other thickness are also contemplated. The conversion layer segments 160 can be sufficiently thick to provide a dipole layer on the gate dielectric layer 150.

In one or more embodiments, a capping layer 170 can be formed on the gate dielectric layer 150 and conversion layer segments 160, where the capping layer 170 can be formed by a conformal deposition (e.g., ALD, PEALD). The capping layer 170 can cover the exposed portions of the conversion layer segments 160 and the gate dielectric layer 150 to protect the underlying layers and act as an etch stop.

In various embodiments, the capping layer 170 can be a transition metal compound, for example, tantalum nitride (TaN), titanium nitride (TiN), tantalum carbide (TaC), titanium carbide (TiC), or a combination thereof.

In various embodiments, the capping layer 170 can have a thickness in a range of about 1 nm to about 2 nm, although other thickness are also contemplated.

Figure 2:
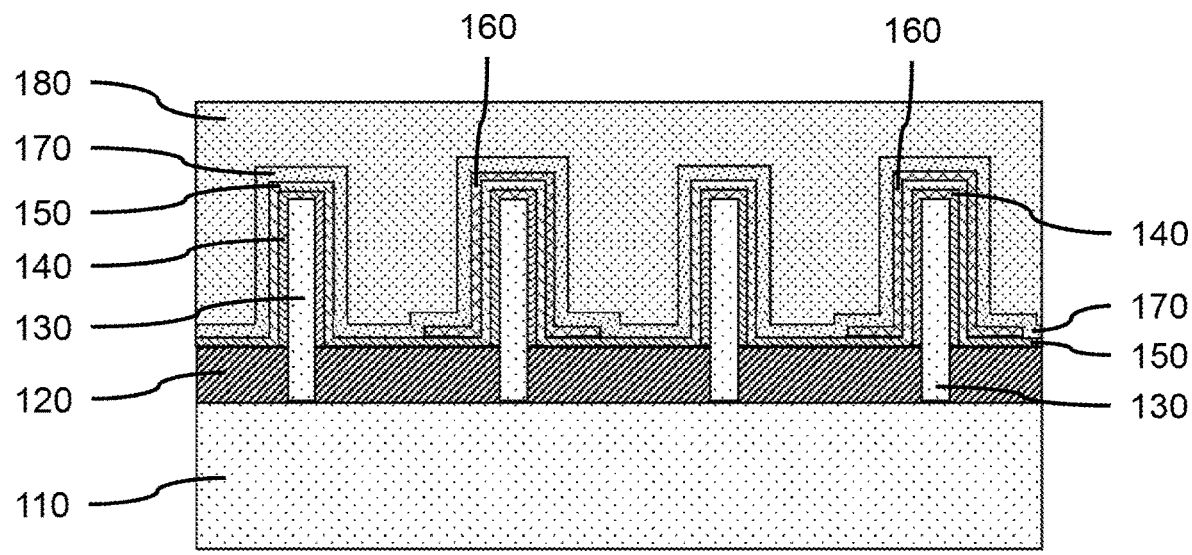
FIG. 2 is a cross-sectional side view showing a cover layer over the capping layer on the plurality of vertical fins, in accordance with an embodiment of the present invention.

FIG. 2 is a cross-sectional side view showing a cover layer over the capping layer on the plurality of vertical fins, in accordance with an embodiment of the present invention;

In one or more embodiments, a protective cover layer 180 can be formed on the capping layer 170 over the vertical fins 130. The protective cover layer 180 can be formed by a blanket deposition (e.g., CVD, PECVD, spin-on) that fills in the spaces between the vertical fins 130 and covers the capping layer 170.

In various embodiments, the protective cover layer 180 can be amorphous silicon (a-Si), amorphous carbon (a-C), amorphous silicon-germanium (a-SiGe), amorphous germanium (a-Ge), and combinations thereof. The protective cover layer 180 can protect the capping layer 170 and underlying layers during a subsequent heat treatment.

Figure 3:
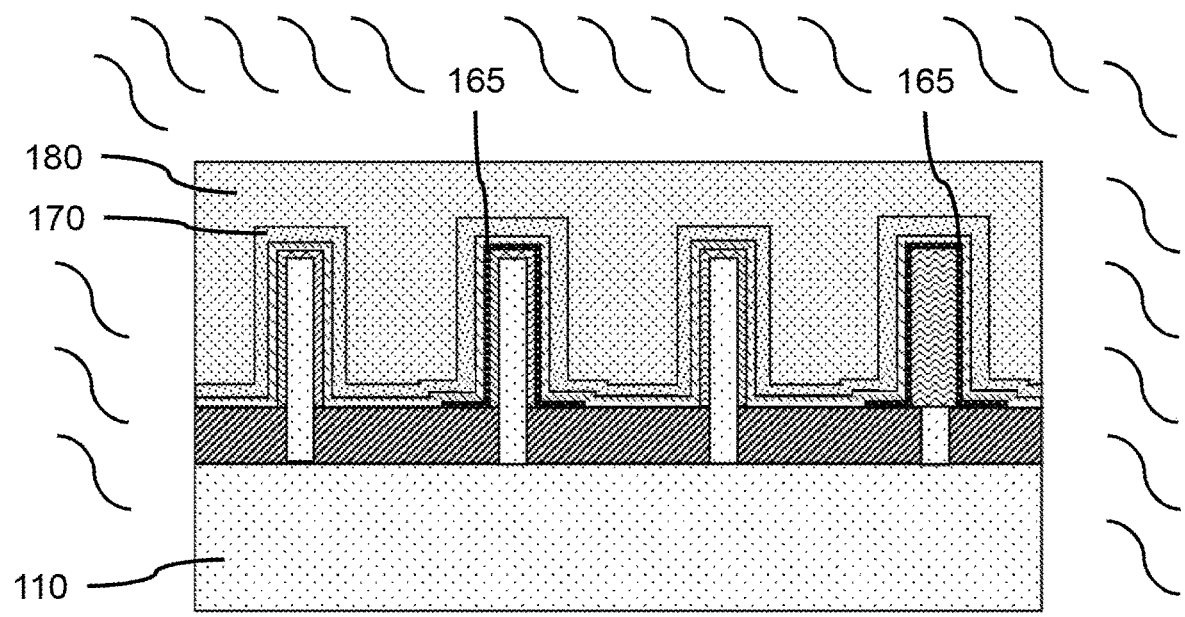
FIG. 3 is a cross-sectional side view showing a heat treatment of the cover layer and the conversion layer segments on the plurality of vertical fins, in accordance with an embodiment of the present invention.

FIG. 3 is a cross-sectional side view showing a heat treatment of the cover layer and the conversion layer segments on the plurality of vertical fins, in accordance with an embodiment of the present invention;

In one or more embodiments, a heat treatment can be conducted to cause diffusion of components of the conversion layer segments 160 into the underlying gate dielectric layer 150 towards the interface with the interfacial layer 140 and outward into the overlying capping layer 170. The diffusion of the components of the conversion layer segments 160 can cause the conversion layer segments 160 to be at least partially absorbed by the adjoining layers. The components of the conversion layer segments 160 can provide for the diffusion of aluminum (Al) from the conversion layer segments 160 through the gate dielectric layer 150 to form an aluminum oxide (AlO) dipole layer 165 at the interface with the interfacial layer 140, where a portion of the aluminum (Al) of the conversion layer segments 160 can form the dipole layer 165. Components of the conversion layer segments 160 can be absorbed by the capping layer 170 during formation of the dipole layer 165, such that the conversion layer segments 160 no longer exist independently. Components of the conversion layer segments may remain at the interface of the gate dielectric layer 150 and overlying capping layer 170.

In various embodiments, the dipole layer 165 can have a thickness of greater than 0 nm, but less than 1 nm, or about 0.5 nm. The dipole layer 165 may be a monolayer of aluminum oxide.

In various embodiments, the heat treatment can be an anneal, including, but not limited to, a laser anneal, a spike anneal, or a rapid thermal anneal (RTA).

In one or more embodiments, the heat treatment can be an anneal, where the anneal can be conducted at a temperature in a range of about 700° C. to about 1100° C., or about 800° C. to about 1000° C., although other temperatures are also contemplated.

In various embodiments, the heat treatment can be conducted for a time period in a range of about 1 nanosecond to about 1 millisecond for a laser anneal, or about 1 nanosecond, or about 1 millisecond for a laser anneal, or about 1 second (sec) to about 10 sec, or about 5 sec to about 10 sec, or about 3 sec to about 7 sec for a spike anneal or rapid thermal anneal, although other time periods are also contemplated. The temperature and duration of the heat treatment can be sufficient to cause all of the conversion layer segments 160 to diffuse and be absorbed by the adjoining layers, where the conversion layer segments can be eliminated and the thickness of the adjoining layers increased, due to the thinness of the conversion layer segments 160.

Figure 4:
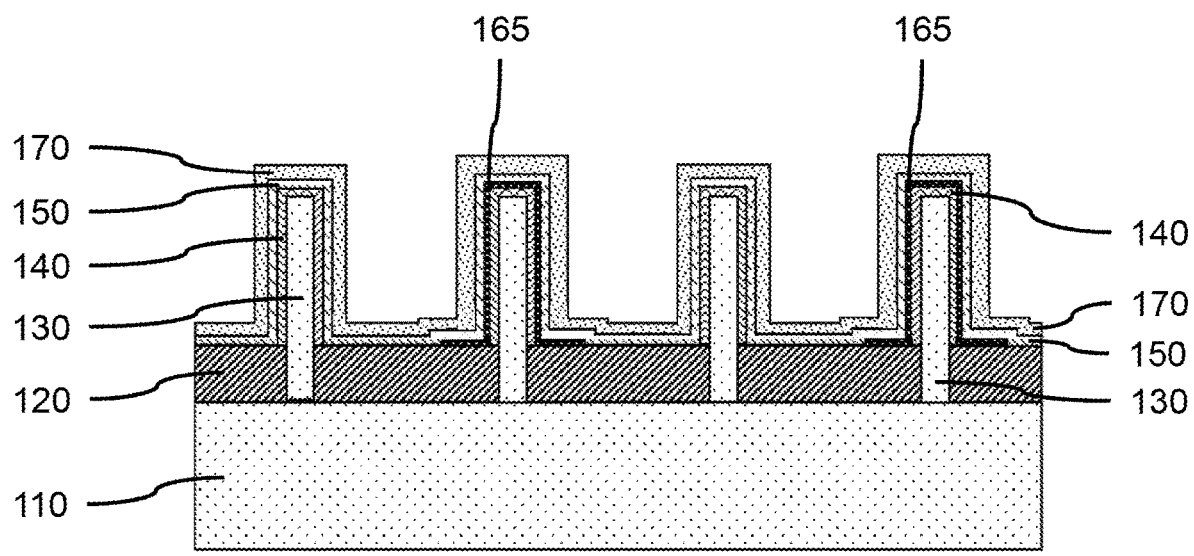
FIG. 4 is a cross-sectional side view showing removal of the cover layer from the capping layer, in accordance with an embodiment of the present invention.

FIG. 4 is a cross-sectional side view showing removal of the cover layer from the capping layer, in accordance with an embodiment of the present invention;

In one or more embodiments, the cover layer can be removed after the heat treatment, where the cover layer 180 can be removed using an isotropic wet etch (e.g., a wet chemical etch). Removal of the cover layer 180 can expose the underlying capping layer 170.

Figure 5:
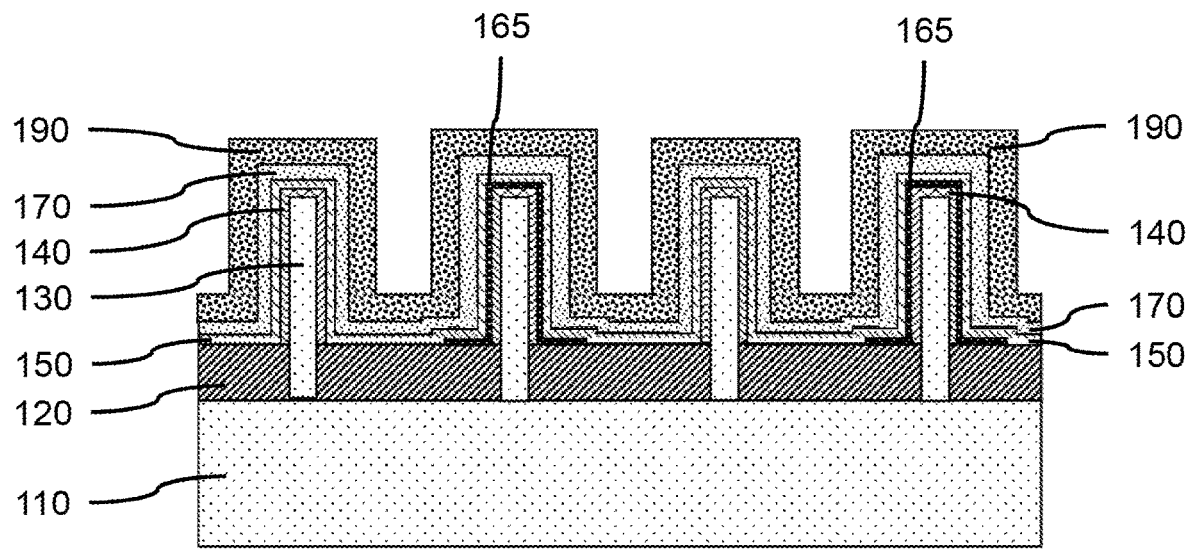
FIG. 5 is a cross-sectional side view showing a first work function layer formed over the capping layer on the plurality of vertical fins, in accordance with an embodiment of the present invention.

FIG. 5 is a cross-sectional side view showing a first work function layer formed over the capping layer on the plurality of vertical fins, in accordance with an embodiment of the present invention.

In one or more embodiments, a first work function layer 190 can be formed over the capping layer 170 on the plurality of vertical fins 130. The first work function layer 190 can be formed by a conformal deposition (e.g., ALD, PEALD).

In various embodiments, the first work function layer can be a transition metal compound, for example, titanium nitride (TiN), tantalum nitride (TaN), tantalum carbide (TaC), hafnium carbide (HfC), and combinations thereof.

In various embodiments, the first work function material layer can have a thickness in a range of about 1 nm to about 10 nm, or about 2 nm to about 6 nm, although other thicknesses are also contemplated.

Figure 6:
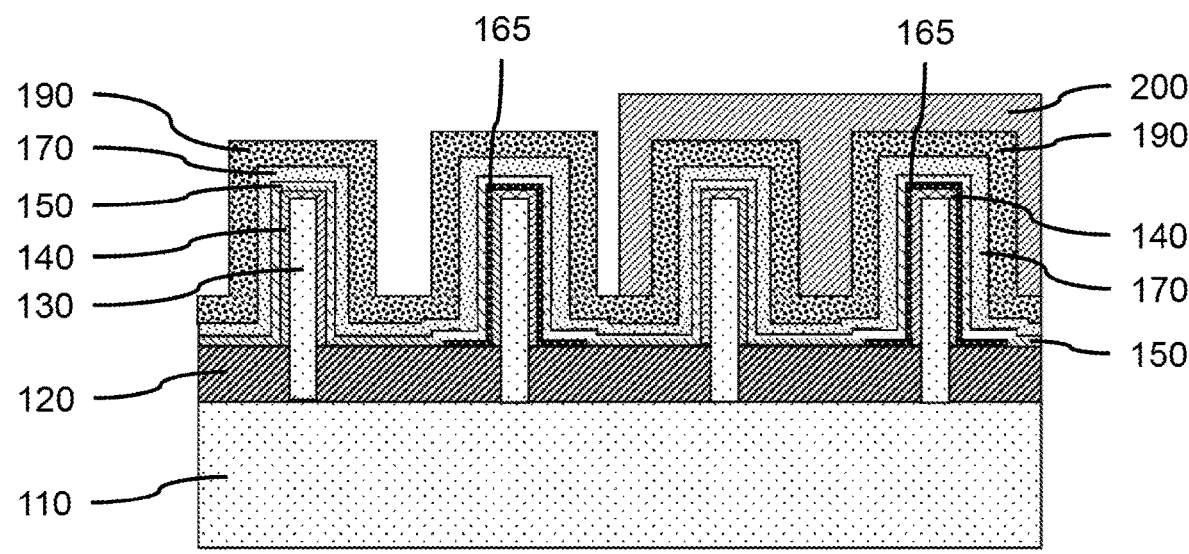
FIG. 6 is a cross-sectional side view showing a masking block formed on a first set of vertical fins covered by the first work function layer, in accordance with an embodiment of the present invention.

FIG. 6 is a cross-sectional side view showing a masking block formed on a first set of vertical fins covered by the first work function layer, in accordance with an embodiment of the present invention.

In one or more embodiments, a masking block 200 can be formed on a set of vertical fins 130 and the first work function layer 190. The masking block 200 can be formed by a blanket deposition and patterning using lithographic techniques and etching, where the masking block 200 can be a resist material, a hardmask material, or a combination thereof.

In various embodiments, the masking block 200 can be a hardmask material, including, but not limited to, silicon oxide (SiO), silicon nitride (SiN), silicon boronitride (SiBN), silicon carbonitride (SiCN), or combinations thereof. In various embodiments, the masking block 200 could be a soft mask such as organic planarization layer (OPL), or a combination of a hardmask and soft mask.

Figure 7:
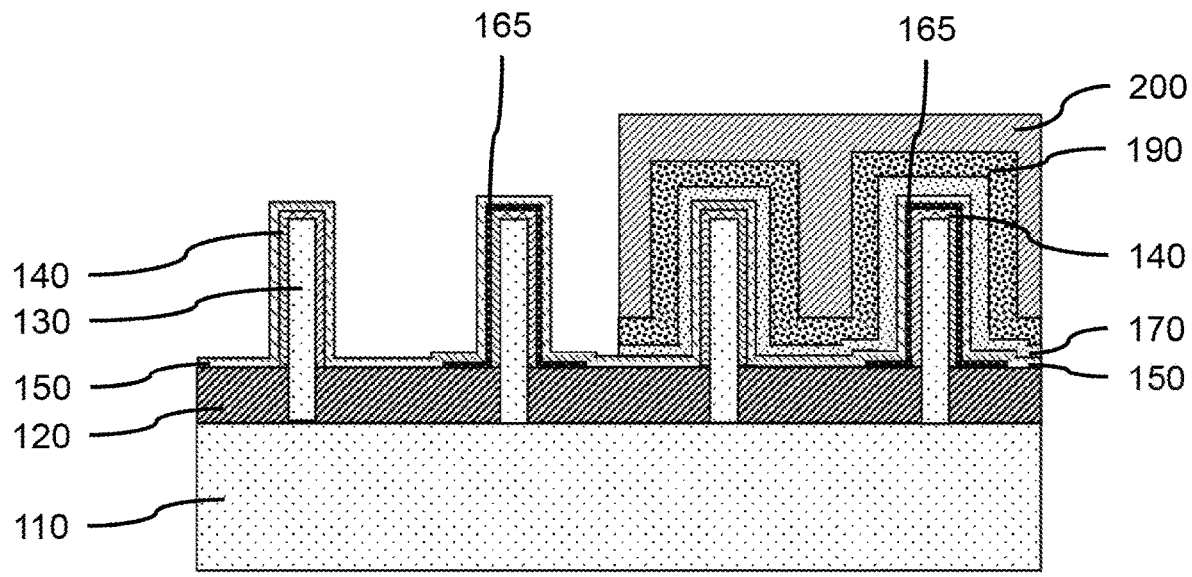
FIG. 7 is a cross-sectional side view showing portions of the first work function layer and the capping layer removed from the gate dielectric layer and the dipole layer on a second set of vertical fins, in accordance with an embodiment of the present invention.

FIG. 7 is a cross-sectional side view showing portions of the first work function layer and the capping layer removed from the gate dielectric layer and the dipole layer on a second set of vertical fins, in accordance with an embodiment of the present invention.

In one or more embodiments, the exposed portion of the first work function layer 190 can be removed using a selective, directional etch, for example, a reactive ion etch (RIE), an isotropic etch (e.g., wet chemical etch), or a combination thereof. Removal of the portion of the first work function layer 190 can expose the underlying portion of the capping layer 170.

In one or more embodiments, the exposed portion of the capping layer 170 can be removed by a selective, directional etch, for example, a reactive ion etch (RIE), an isotropic etch (e.g., wet chemical etch), or a combination thereof. Removal of the portion of the capping layer 170 can expose portions of the gate dielectric layer 150 on the second set of vertical fins 130.

Figure 8:
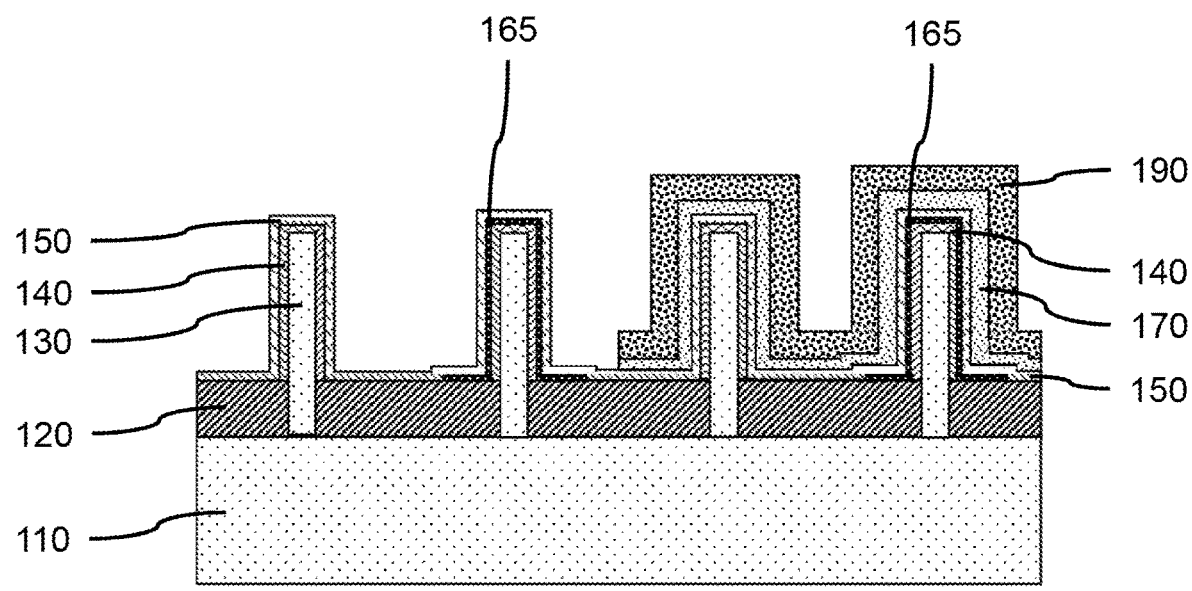
FIG. 8 is a cross-sectional side view showing the masking block removed from the first set of vertical fins with the first work function layer, in accordance with an embodiment of the present invention.

FIG. 8 is a cross-sectional side view showing the masking block removed from the first set of vertical fins with the first work function layer, in accordance with an embodiment of the present invention.

In one or more embodiments, the masking block 200 can be removed from the second set of vertical fins 130 with the remaining portion of the first work function layer 190. The masking block can be removed using a selective isotropic etch, for example, a wet chemical etch or dry plasma etch. Removal of the masking block 200 can expose the underlying first work function layer 190 on the first set of vertical fins 130. The dipole layers 165 can remain on a subset of vertical fins 130, including a vertical fin in the first set and a vertical fin in the second set.

Figure 9:
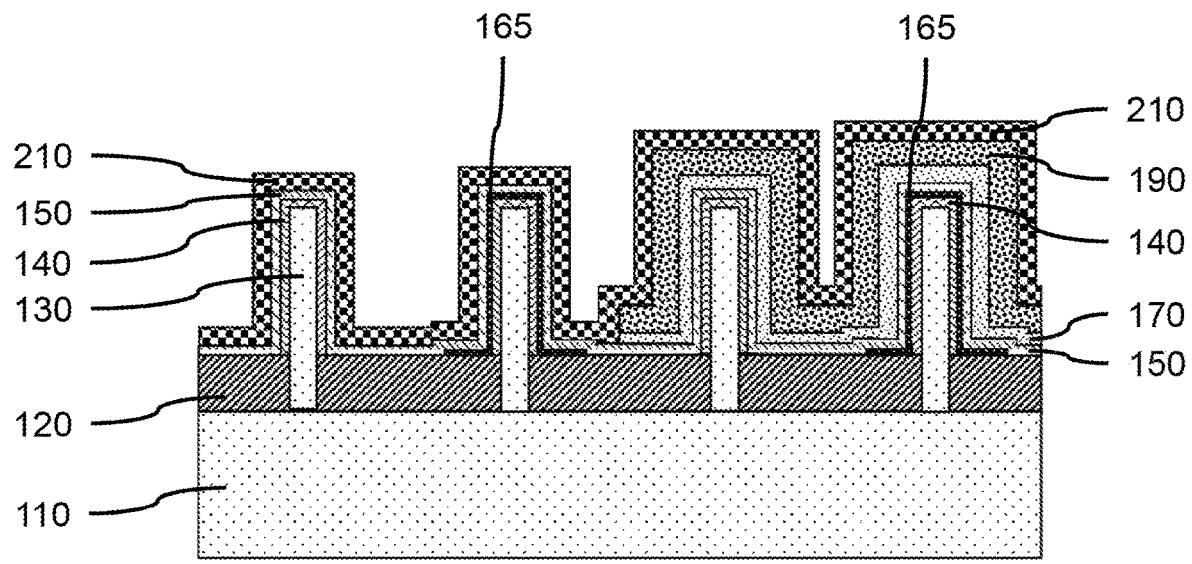
FIG. 9 is a cross-sectional side view showing a second work function material layer formed on the first work function material on the first set of vertical fins and on the gate dielectric layer on the second set of vertical fins, in accordance with an embodiment of the present invention.

FIG. 9 is a cross-sectional side view showing a second work function material layer formed on the first work function material on the first set of vertical fins and on the gate dielectric layer on the second set of vertical fins, in accordance with an embodiment of the present invention.

In one or more embodiments, a second work function material layer 210 can be formed on the first work function material layer 190 on the second set of vertical fins and on the gate dielectric layer 150 on the first set of vertical fins 130. The second work function material layer 210 can be formed by a conformal deposition.

In various embodiments, the second work function material layer 210 can be a transition metal compound, for example, titanium carbide (TiC), tantalum carbide (TaC), tantalum-aluminum carbide (TaAlC), titanium-aluminum (TiAl), titanium-aluminum carbide (TiAlC), aluminum carbide (AlC), as well as other materials containing aluminum (Al).

In various embodiments, the second work function material layer 210 can have a thickness in a range of about 1 nm to about 10 nm, or about 2 nm to about 6 nm, although other thicknesses are also contemplated.

Figure 10:
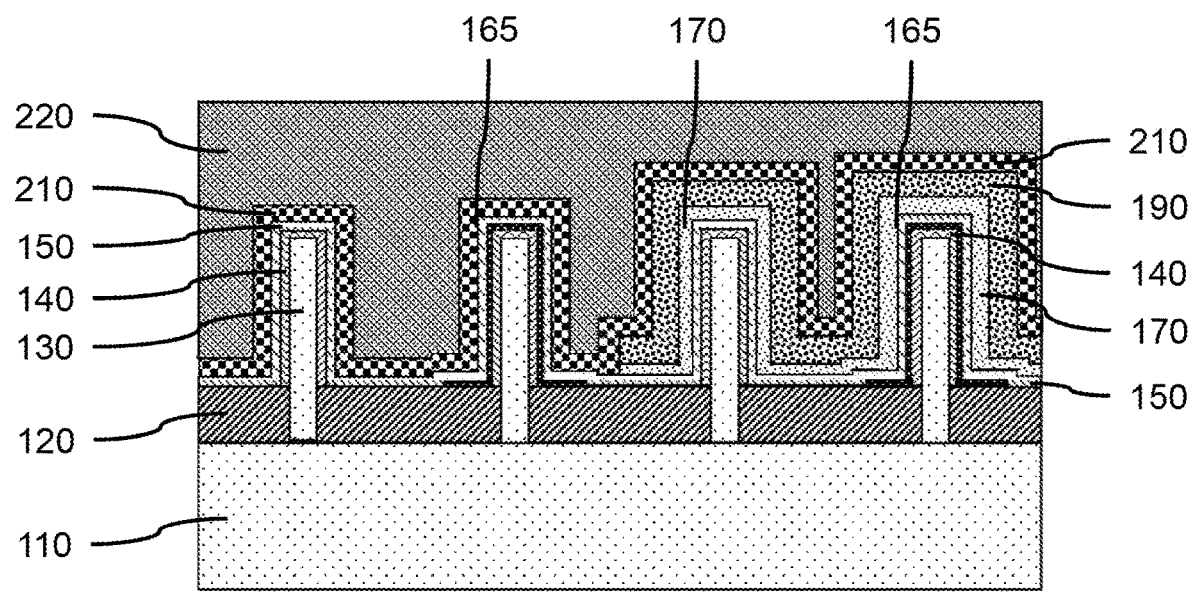
FIG. 10 is a cross-sectional side view showing an interconnect gate electrode formed on the second work function material layer on the first set of vertical fins and the second set of vertical fins, in accordance with an embodiment of the present invention.

FIG. 10 is a cross-sectional side view showing an interconnect gate electrode formed on the second work function material layer on the first set of vertical fins and the second set of vertical fins, in accordance with an embodiment of the present invention.

In one or more embodiments, an interconnect gate electrode 220 can be formed on the second work function material layer on the first set of vertical fins and the second set of vertical fins, for example, by a blanket deposition. The interconnect gate electrode 220 can cover and electrically contact the second work function material layer 210. The interconnect gate electrode 220 can connect the work function metals with a lower resistivity.

In various embodiments, the fin field effect transistor devices can be further processed to electrically separate the vertical fins and gate structures into separate devices, and electrical contacts can be formed to the gate structures, and the sources and drains formed on the vertical fins. Although the devices are depicted together and electrically interconnected, this is not intended to be limiting. The structures on the different vertical fins 130 can also be either isolated from each other or two of devices with opposite polarity can be connected by the interconnect gate electrode 220 and the other devices electrically separated from the connected pair.

In various embodiments, the interconnect gate electrode 220 can be low resistance metal, including, but not limited to, tungsten (W), aluminum (Al), cobalt (Co), and combinations thereof. In various embodiments, the interconnect gate electrode 220 is not copper.

In various embodiments, a source/drain can be formed on opposite sides of the gate structure on each of the vertical fins 130, where the source/drains can be n-doped source/drains or p-doped source/drains. The source/drains and gate structure on the vertical fin(s) can form a horizontal transport fin field effect transistor device. In various embodiments, isolation regions can be formed between the vertical fins to physically separate and electrically isolate different devices using different subsets of vertical fins 130.

Figure 11:
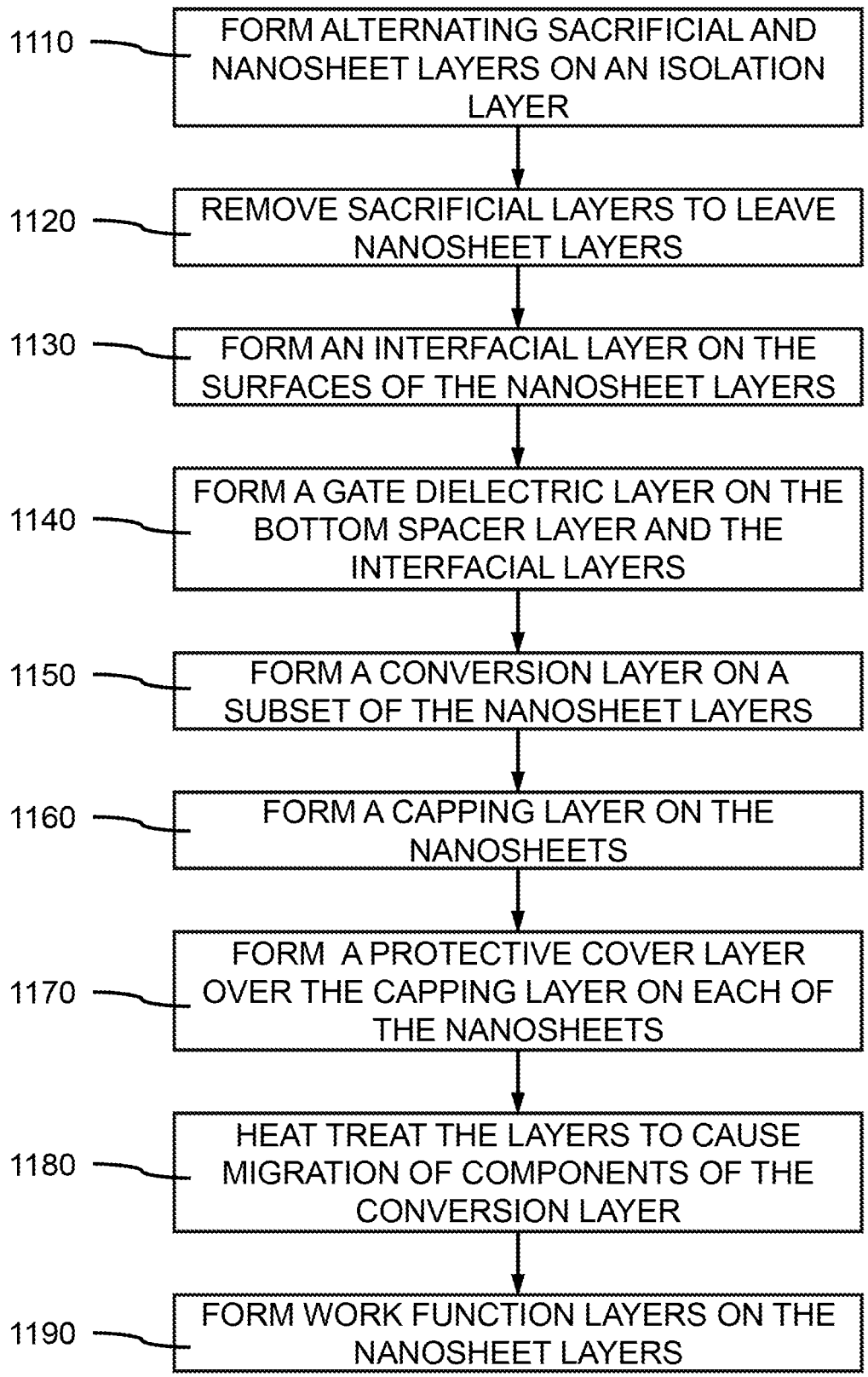
FIG. 11 is a Block/Flow Diagram showing the fabrication of nanosheet type field effect transistor devices with adjusted threshold voltages, in accordance with an embodiment of the present invention.

FIG. 11 is a Block/Flow Diagram showing the fabrication of nanosheet type field effect transistor devices with adjusted threshold voltages, in accordance with an embodiment of the present invention.

In block 1110, the precursor layers for a nanosheet type field effect transistor device can be formed. A plurality of alternating sacrificial layers and nanosheet layers can be formed on a substrate 110 or an isolation layer 120 on a substrate. The alternating sacrificial layers and nanosheet layers can be formed by epitaxial growth on the substrate and an intervening semiconductor layer on the substrate can subsequently be replaced by an isolation layer 120. The alternating sacrificial layers and nanosheet layers can be different semiconductor materials that can be selectively etched, for example, silicon (Si) and silicon-germanium (SiGe). The alternating sacrificial layers and nanosheet layers can be patterned to form a plurality of nanosheet type FET devices, where each FET device includes one or more nanosheet layers. A dummy gate structure can be formed on each of the nanosheet devices.

In block 1120, the sacrificial layers can be removed from between the nanosheet layers of each of the nanosheet type devices, where the sacrificial layers can be removed using a selective isotropic etch. The nanosheet layers with exposed surfaces can remain, where the nanosheet layers can be supported by source/drains on opposite sides of the nanosheet layers. A portion of the dummy gate structures can be removed to expose the nanosheet layers of each of the nanosheet devices.

In block 1130, an interfacial layer 140 can be formed on the exposed surfaces of each of the nanosheet layers for each of the plurality of nanosheet devices using a wet or dry plasma process that reacts with the material of the vertical fins 130.

In block 1140, a gate dielectric layer 150 can be formed on the isolation layer 120 and the surfaces of the interfacial layer 140 on each of the nanosheet layers.

In block 1150, conversion layer segments 160 can be formed on the nanosheets layers of a subset of the nanosheet type FET devices. In various embodiments, the one or more nanosheet layers of at least one n-type nanosheet type FET device and the one or more nanosheet layers of at least one p-type nanosheet type FET device can be covered by a conversion layer segment 160. In various embodiments, the one or more nanosheet layers of at least one n-type nanosheet type FET device or the one or more nanosheet layers of at least one p-type nanosheet type FET device can be covered by a conversion layer segment 160. In various embodiments, the one or more nanosheet layers of two or more n-type nanosheet type FET devices and the one or more nanosheet layers of two or more p-type nanosheet type FET devices can be covered by a conversion layer segment 160.

In block 1160, a capping layer 170 can be formed on the conversion layer segments 160 of the subset of devices and the gate dielectric layer 150 on the other subset of devices.

In block 1170, a protective cover layer 180 can be formed on the capping layers 170, where the protective cover layer 180 can be formed on the n-type nanosheet type FET devices and the p-type nanosheet type FET devices. The protective cover layer 180 can fill in the dummy gate structure.

In block 1180, the nanosheet type FET devices can be heat treated to diffuse components of the conversion layer segments 160 into the adjoining layers to form a dipole layer 165 at the interface of the interfacial layer 140 and gate dielectric layer 150 on the subset of nanosheet type FET devices. In various embodiments, the dipole layers 165 can be formed on at least one n-type nanosheet type FET device and at least one p-type nanosheet type FET device.

In block 1190, the protective cover layer 180 can be removed from the dummy gate structures and capping layers 170 using an isotropic etch. In various embodiments, the capping layers 170 can be removed using an isotropic etch. A first work function layer 190 can be formed on a first set of nanosheet type FET devices, where the first set of nanosheet type FET devices can be p-type nanosheet type FET devices. A second work function layer 210 can be formed on a second set of nanosheet type FET devices, where the second set of nanosheet type FET devices can be n-type nanosheet type FET devices. The first work function layer 190 can be a work function material (WFM) different from the second work function layer 210.

Figure 12:
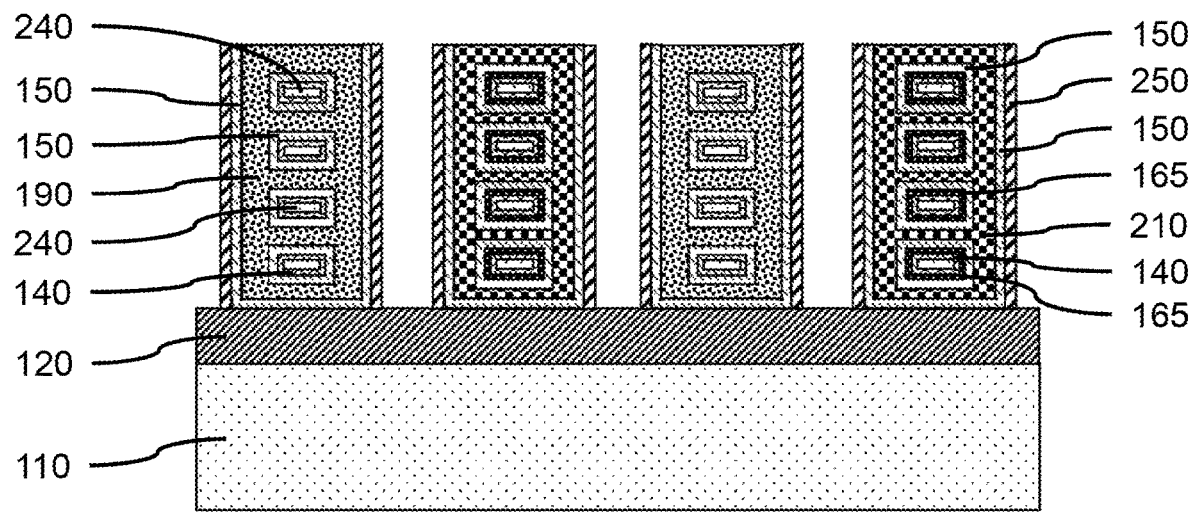
FIG. 12 is a cross-sectional side view showing a plurality of nanosheet-type field effect transistor devices with adjusted threshold voltages, in accordance with an embodiment of the present invention.

FIG. 12 is a cross-sectional side view showing a plurality of nanosheet-type field effect transistor devices with adjusted threshold voltages, in accordance with an embodiment of the present invention.

In one or more embodiments, a plurality of stacks of semiconductor nanosheet layers 240 can be formed on a substrate 110, where the nanosheets can form device channels for each of the plurality of FET devices. An isolation layer 120 can physically separate and electrically insulate the nanosheet-type field effect transistor devices from a semiconductor substrate 110. The nanosheet-type field effect transistor devices can be formed on a semiconductor-on-insulator (SeOI) substrate 110.

In one or more embodiments, an interfacial layer 140 can be formed on each of the nanosheet layers 240, and a gate dielectric layer 150 can be formed on the interfacial layer 140. A first work function layer 190 can be formed on a first set of nanosheet type FET devices, where the first set of nanosheet type FET devices can be n-type nanosheet type FET devices. A second work function layer 210 can be formed on a second set of nanosheet type FET devices, where the second set of nanosheet type FET devices can be p-type nanosheet type FET devices. The first work function layer 190 can be a work function material (WFM) different from the second work function layer 210.

Figure 13:
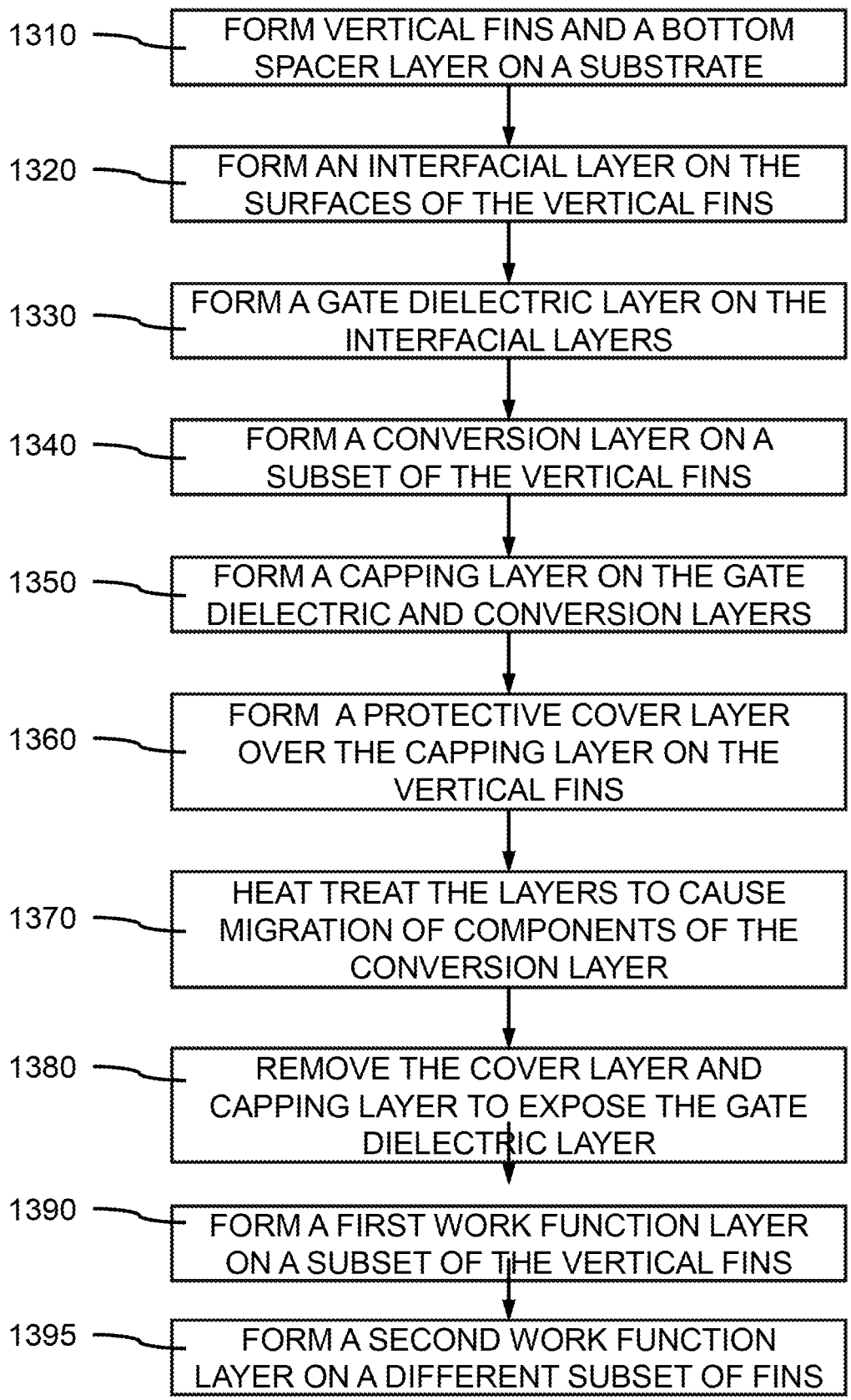
FIG. 13 is a Block/Flow Diagram showing the fabrication of vertical transport field effect transistor (VTFET) devices with adjusted threshold voltages, in accordance with an embodiment of the present invention.

FIG. 13 is a Block/Flow Diagram showing the fabrication of vertical transport field effect transistor (VTFET) devices with adjusted threshold voltages, in accordance with an embodiment of the present invention.

In block 1310, a plurality of vertical fins 130 can be formed on a substrate 110. A bottom source/drain layer can be formed on the substrate below the vertical fins. An isolation layer can be formed on the bottom source/drain layer adjacent to the vertical fins.

In block 1320, an interfacial layer 140 can be formed on the portions of the vertical fins 130 exposed above the isolation layer 120.

In block 1330, a gate dielectric layer 150 can be formed on the interfacial layer 140 and exposed surface of the isolation layer 120.

In block 1340, a conversion layer segments 160 can be formed on the exposed surfaces of the gate dielectric layer 150 for a subset of the vertical fins 130.

In block 1350, a capping layer 170 can be formed on the exposed surfaces of the gate dielectric layers 150 and conversion layer segments 160.

In block 1360, a protective cover layer 180 can be formed on the capping layer 170 over the vertical fins 130. The protective cover layer 180 can be formed by a blanket deposition (e.g., CVD, PECVD, spin-on) that fills in the spaces between the vertical fins 130 and covers the capping layer 170.

In block 1370, a heat treatment can be conducted to cause diffusion of components of the conversion layer segments 160 into the underlying gate dielectric layer 150 and outward into the overlying capping layer 170. The diffusion of the components of the conversion layer segments 160 can cause the conversion layer segments 160 to be absorbed by the adjoining layers, where the components of the conversion layer segments 160 can provide for the diffusion of aluminum (Al) from the conversion layer segments 160 through the gate dielectric layer 150 to form a dipole layer 165 with the interfacial layer 140. The remaining portion of the conversion layer can be an aluminum deficient reduced conversion layer.

In block 1380, the cover layer 180 can be removed to expose the capping layer 170.

In block 1390, a first work function layer 190 can be formed on a first set of the vertical fins, where the first set of vertical fins can include a vertical fin with a dipole layer 165.

In block 1395, a second work function layer 210 can be formed on a second set of the vertical fins, where the second set of vertical fins can include a vertical fin with a dipole layer 165.

Figure 14:
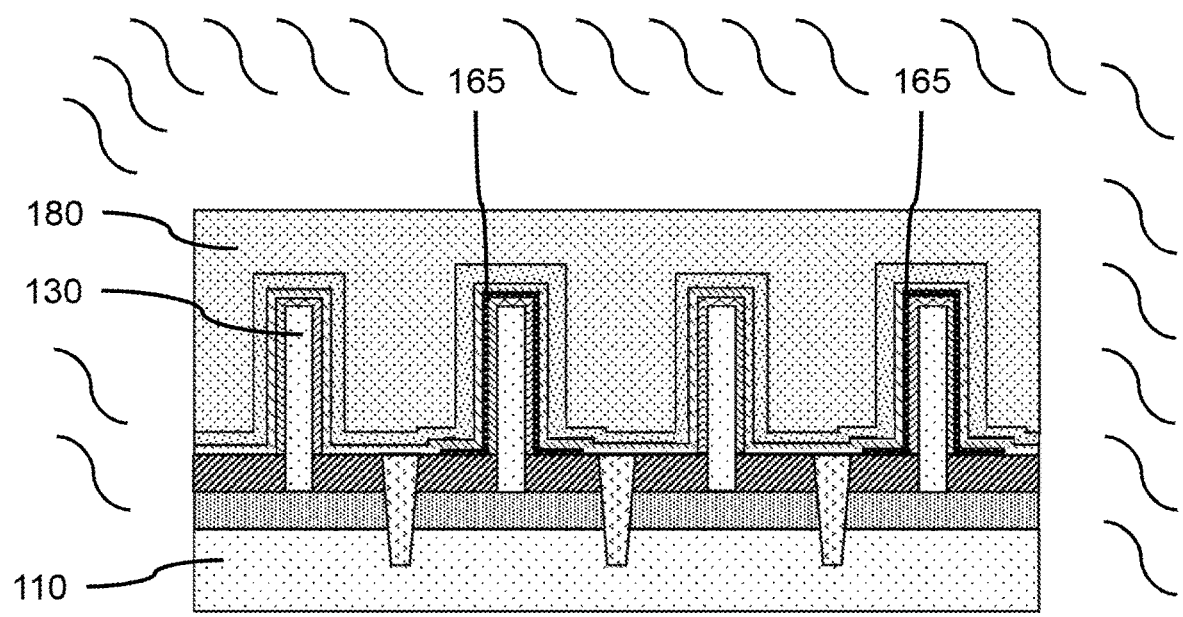
FIG. 14 is a cross-sectional side view showing a heat treatment of the cover layer and the conversion layer segments on the VTFET devices, in accordance with an embodiment of the present invention.

FIG. 14 is a cross-sectional side view showing a heat treatment of the cover layer and the conversion layer segments on the VTFET devices, in accordance with an embodiment of the present invention.

In one or more embodiments, a plurality of vertical fins 130 including conversion layer segments 160 on at least two vertical fins can be heat treated to form dipole layers 165. The vertical fins 130 and conversion layer segments 160 can be covered by a protective cover layer 180 during the heat treatment.

In various embodiments, the heat treatment can be an anneal, including, but not limited to, a laser anneal, a spike anneal, or a rapid thermal anneal (RTA).

In one or more embodiments, the heat treatment can be an anneal, where the anneal can be conducted at a temperature in a range of about 700° C. to about 1100° C., or about 800° C. to about 1000° C., although other temperatures are also contemplated.

In various embodiments, the heat treatment can be conducted for a time period in a range of about 1 nanosecond to about 1 millisecond for a laser anneal, or about 1 nanosecond, or about 1 millisecond for a laser anneal, or about 1 second (sec) to about 10 sec, or about 5 sec to about 10 sec, or about 3 sec to about 7 sec for a spike anneal or rapid thermal anneal, although other time periods are also contemplated. The temperature and duration of the heat treatment can be sufficient to cause all of the conversion layer segments 160 to diffuse and be absorbed by the adjoining layers, where the thickness of the remaining portion of the conversion layer segments can be reduced to form the dipole layer 165 and the thickness of the adjoining layers increased.

Figure 15:
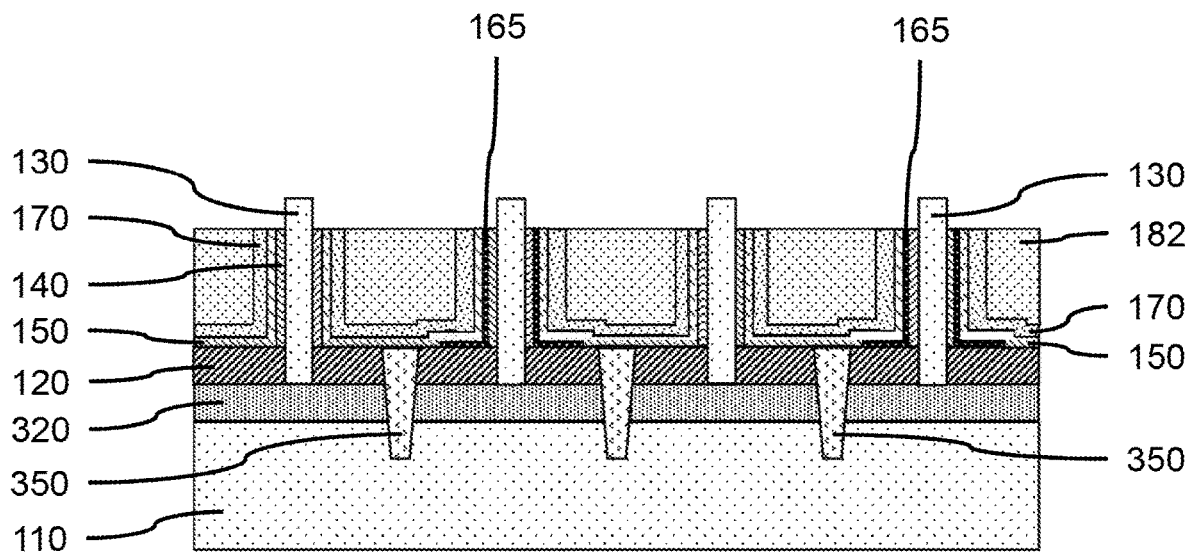
FIG. 15 is a cross-sectional side view showing the formation of gate structures on the plurality of VTFET devices, in accordance with an embodiment of the present invention.

FIG. 15 is a cross-sectional side view showing the formation of gate structures on the plurality of VTFET devices, in accordance with an embodiment of the present invention.

In one or more embodiments, the height of the protective cover layer 180 can be reduced using a directional etch (e.g., RIE) to form a reduced height cover layer 182 and expose an upper portion of the capping layer 170 on the vertical fins 130. The exposed portion of the capping layer 170 can be removed using a selective isotropic etch to expose the underlying gate dielectric layer 150, dipole layer 165, and interfacial layer 140. Each of the underlying layers can also be removed using selective isotropic etches to expose the upper portion of the vertical fins 130.

In one or more embodiments, a trench isolation region(s) 350 including a dielectric fill can be formed between the vertical fins 130 to electrically separate the bottom source/drain layer into separate source/drain regions 320, and the vertical fins 130 into separate VTFETs.

Figure 16:
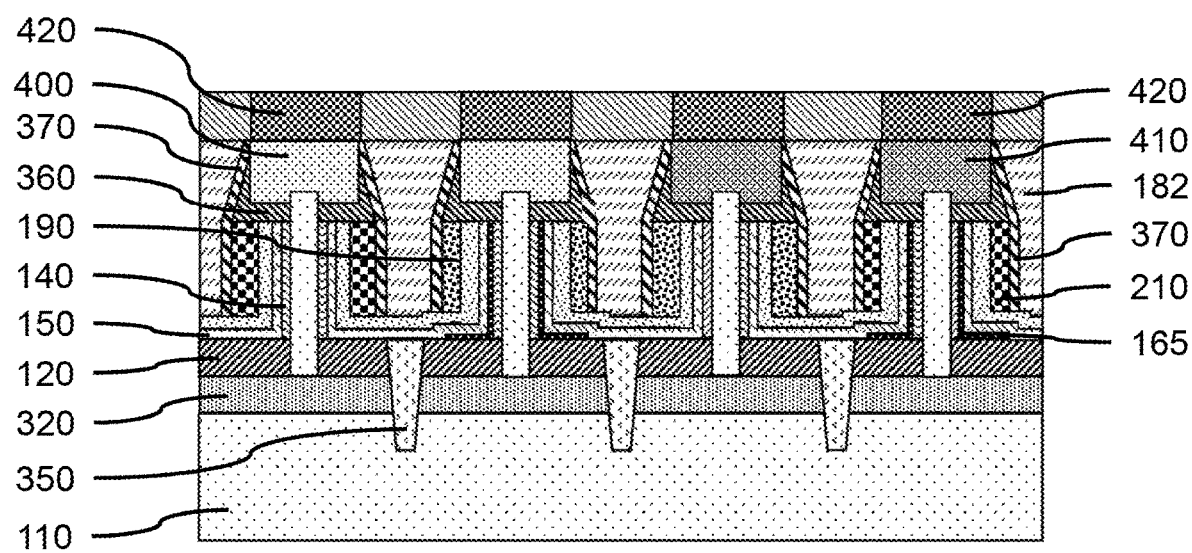
FIG. 16 is a cross-sectional side view showing gate structures and top source/drains with contacts on the plurality of VTFET devices, in accordance with an embodiment of the present invention.

FIG. 16 is a cross-sectional side view showing gate structures and top source/drains with contacts on the plurality of VTFET devices, in accordance with an embodiment of the present invention.

In one or more embodiments, the reduced height cover layer 182 can be masked and patterned to form cover layer segments adjacent to the vertical fins 130. The cover layer segments can be covered by a dielectric top spacer layer 360. A dielectric barrier liner 370 can be formed on the cover layer segments and dielectric top spacer layer 360, where the dielectric top spacer layer 360 and dielectric barrier liner 370 can be for example, silicon nitride (SiN), silicon oxy carbonitride (SiOCN), silicon boro carbonitride (SiBCN), or a combination thereof. The dielectric barrier liner 370 can be a different material from the dielectric top spacer layer 360.

In one or more embodiments, the cover layer segments and portion of the capping layer 170 can be removed using a selective isotropic etch. A first work function layer 190 can be formed on a first set of the vertical fins 130, where the first set of vertical fins can include a vertical fin 130 with a dipole layer 165. A second work function layer 210 can be formed on a second set of the vertical fins 130, where the second set of vertical fins can include a vertical fin 130 with a dipole layer 165. The first or second work function layer and the gate dielectric layer 150 can form a gate structure on the vertical fin 130, where the portion of the vertical fin adjacent to the gate structure can form a device channel of a VTFET.

Figure 17:
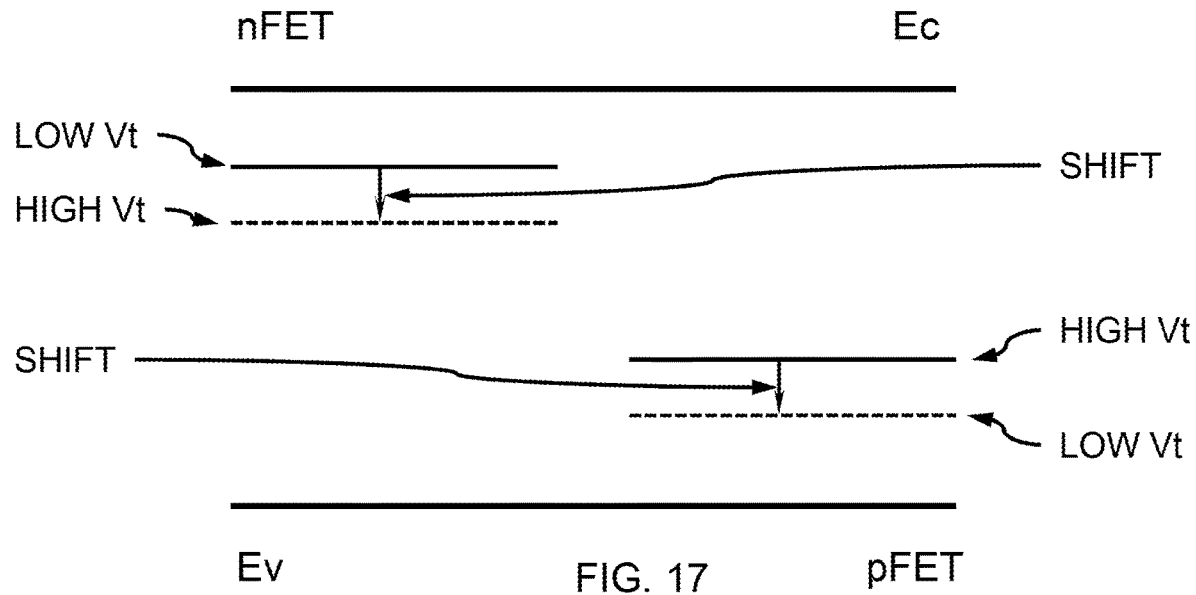
FIG. 17 is a diagram showing the shift of the threshold voltages of field effect transistor devices due to the dipole layers, in accordance with an embodiment of the present invention.

FIG. 17 is a diagram showing the shift of the threshold voltages of field effect transistor devices due to the conversion layer segments, in accordance with an embodiment of the present invention.

In one or more embodiments, an n-type field effect transistor (FET) device and a p-type field effect transistor (FET) device can be formed on the same substrate. The dipole 165 can be formed on each of the FET devices to shift the threshold voltage of both an n-type FET and a p-type FET.

In various embodiments, a p-type FET device can have a conversion layer segments 160 formed and heat treated to shift the threshold voltage to a lower value, LOW Vt, and an n-type FET device can have a conversion layer segments formed and heat treated to shift the threshold voltage to a higher value, HIGH Vt. The threshold value of the p-type field effect transistor device can be shifted to a threshold voltage closer to the energy of the valence band (Ev), whereas the threshold value of the n-type field effect transistor device can be shifted to a threshold voltage closer to the energy of the conduction band (Ec). The shift of the threshold voltage is caused by the band diagram bending which is caused by the dipole layer 165.

Figure 18:
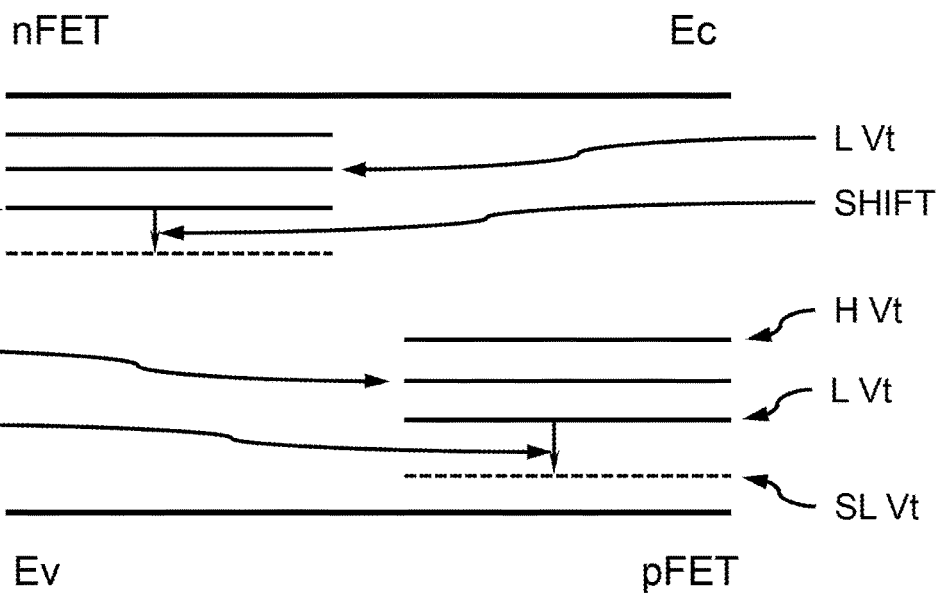
FIG. 18 is a diagram showing the shift of the threshold voltages of transistor devices due to the dipole layers, in accordance with another embodiment of the present invention.

FIG. 18 is a diagram showing the shift of the threshold voltages of transistor devices due to the conversion layer segments, in accordance with another embodiment of the present invention.

In one or more embodiments, a plurality of n-type field effect transistor (FET) devices and a plurality of p-type field effect transistor (FET) devices can be formed on the same substrate, where different n-type FETs can have different threshold voltages and different p-type FETs can have different threshold voltages.

In various embodiments, one of a plurality of p-type FET devices that has the lowest threshold voltage, L Vt (L=low), can have a conversion layer segments formed and heat treated to shift the threshold voltage to an even lower value, SL Vt (SL=super low). One of a plurality of n-type FET devices that has the highest threshold voltage, R Vt (R=regular or normal), can have a conversion layer segments formed and heat treated to shift the threshold voltage to a higher value, H Vt (H=HIGH). The threshold value of the p-type FET device can be shifted to a threshold voltage closer to the energy of the valence band (Ev) to decrease the energy gap, whereas the threshold value of the n-type FET device can be shifted to a threshold voltage further from the energy of the conduction band (Ec) to increase the energy gap.

Figure 19:
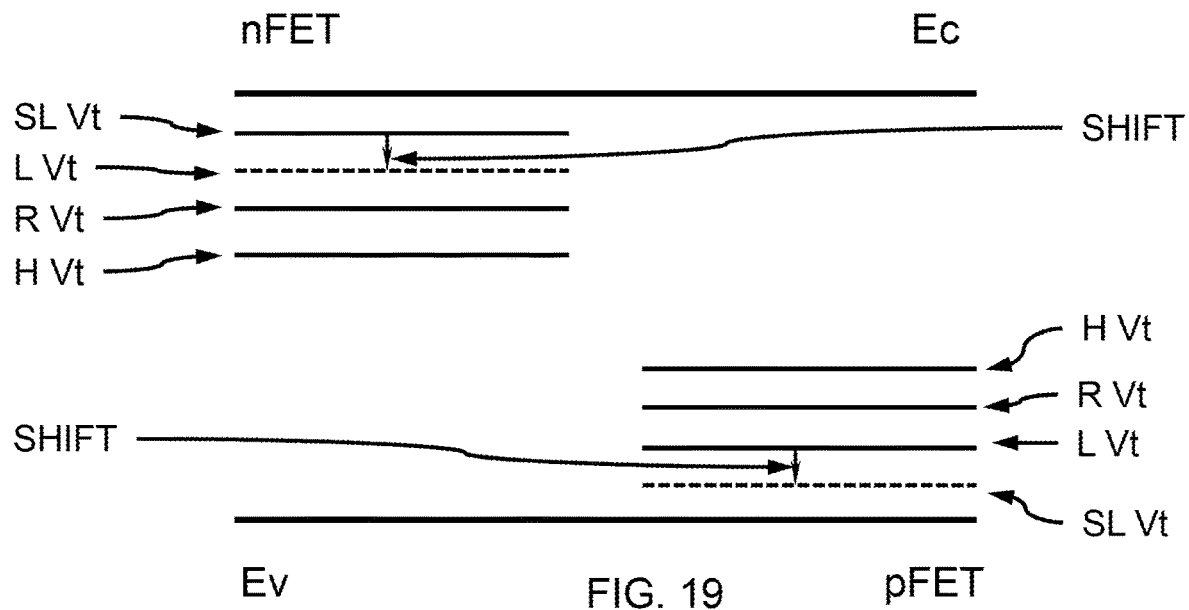
FIG. 19 is a diagram showing the shift of the threshold voltages of transistor devices due to the dipole layers, in accordance with yet another embodiment of the present invention.

FIG. 19 is a diagram showing the shift of the threshold voltages of transistor devices due to the conversion layer segments, in accordance with yet another embodiment of the present invention.

In one or more embodiments, a plurality of n-type field effect transistor (FET) devices and a plurality of p-type field effect transistor (FET) devices can be formed on the same substrate, where different n-type FETs can have different threshold voltages and different p-type FETs can have different threshold voltages.

In various embodiments, one of a plurality of p-type FET devices that has the lowest threshold voltage, L Vt, can have a conversion layer segments formed and heat treated to shift the threshold voltage to an even lower value, SL Vt. One of a plurality of n-type FET devices that also has the lowest threshold voltage, SL Vt, can have a conversion layer segments formed and heat treated to shift the threshold voltage to a higher value, L Vt. The threshold value of the p-type FET device can be shifted to a threshold voltage closer to the energy of the valence band (Ev), whereas the threshold value of the n-type FET device can be shifted to a threshold voltage closer to the energy of the conduction band (Ec).

Figure 20:
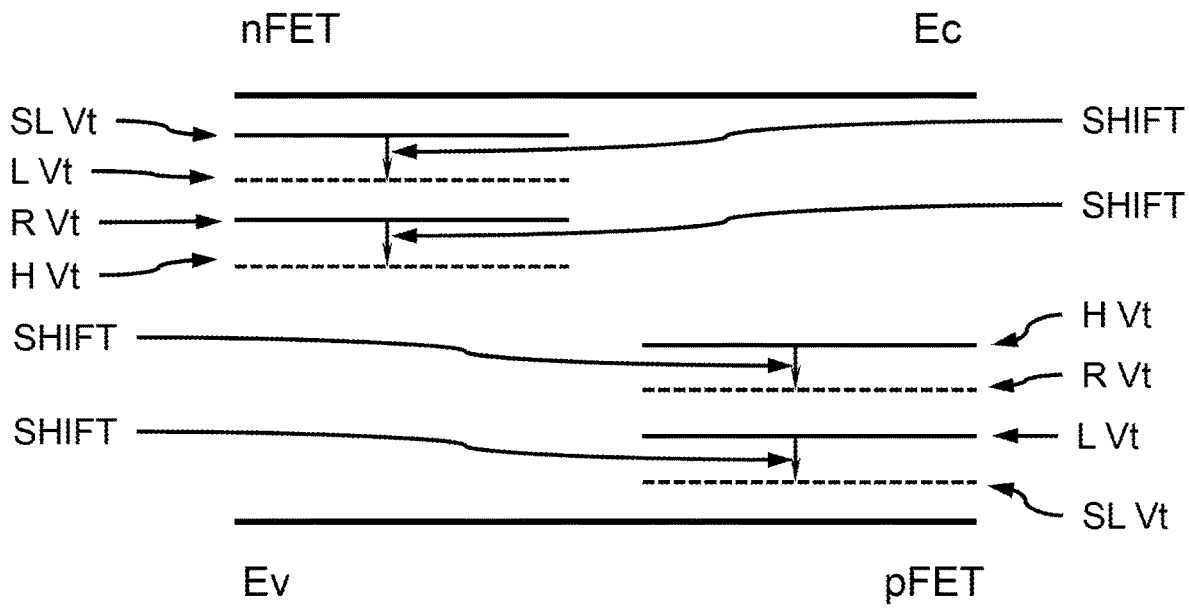
FIG. 20 is a diagram showing the shift of the threshold voltages of transistor devices from the dipole layers, in accordance with still another embodiment of the present invention.

FIG. 20 is a diagram showing the shift of the threshold voltages of transistor devices from the conversion layer segments, in accordance with still another embodiment of the present invention.

In one or more embodiments, a plurality of n-type field effect transistor (FET) devices and a plurality of p-type field effect transistor (FET) devices can be formed on the same substrate, where different n-type FETs can have different threshold voltages and different p-type FETs can have different threshold voltages.

In various embodiments, one of a plurality of p-type FET devices that has the lowest threshold voltage, L Vt, can have a conversion layer segments formed and heat treated to shift the threshold voltage to an even lower value, SL Vt. One of the plurality of p-type FET devices that has the highest threshold voltage, H Vt, can have a conversion layer segments formed and heat treated to shift the threshold voltage to a lower value, R Vt, that is still greater than the threshold voltage, L Vt. One of a plurality of n-type FET devices that also has the lowest threshold voltage, SL Vt, can have a conversion layer segments formed and heat treated to shift the threshold voltage to a higher value, L Vt. One of the plurality of n-type FET devices that has the highest threshold voltage, R Vt, can have a conversion layer segments formed and heat treated to shift the threshold voltage to a lower value, H Vt.

In a non-limiting exemplary embodiments, a pair of field effect transistor devices each having a gate structure can include an interfacial layer on each semiconductor device channel of the pair of field effect transistor devices; a dipole layer on the interfacial layer on each of the pair of field effect transistor devices; a gate dielectric layer on the dipole layers; a first work function layer on a first field effect transistor device of the pair of transistor devices; and a second work function layer on a second field effect transistor device of the pair of transistor devices.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A device, comprising:
   an interfacial layer on a first semiconductor device channel;
   a dipole layer on the interfacial layer;
   a gate dielectric layer on the dipole layer; and
   a first work function layer on the gate dielectric layer, wherein the dipole layer shifts the threshold voltage of a first field effect transistor device including the first work function layer.

2. The device of claim 1, wherein the dipole layer is aluminum oxide (AlO).

3. The device of claim 1, further comprising a second work function layer on the first work function layer of the first field effect transistor device.

4. The device of claim 1, wherein the first field effect transistor device is a nanosheet type transistor device.

5. The device of claim 1, wherein the first field effect transistor device is a vertical transport field effect transistor device.

6. A plurality of field effect transistor devices, comprising:
   a gate structure on each of the plurality of field effect transistors, wherein each gate structure includes an interfacial layer on a semiconductor device channel of each of field effect transistor devices, wherein a first set of the plurality of field effect transistor devices are n-type field effect transistor devices and a second set of the plurality of field effect transistor devices are p-type field effect transistor devices;
   a first dipole layer on the interfacial layer on at least one of the n-type field effect transistor devices, and a second dipole layer on at least one of the p-type field effect transistor devices;
   a gate dielectric layer on each of the interfacial layers;
   a first work function layer on the gate dielectric layer on the first set of the plurality of field effect transistor devices; and
   a second work function layer on the gate dielectric layer on the second set of the plurality of field effect transistor devices, wherein the first work function layer is a work function material (WFM) different from the second work function layer, and wherein the first dipole layer shifts the threshold voltage of the first field effect transistor device having the first work function layer, and the second dipole layer shifts the threshold voltage of the second field effect transistor device having the second work function layer.

7. The plurality of field effect transistor devices of claim 6, wherein the plurality of field effect transistor devices includes at least four field effect transistor devices.

8. The plurality of field effect transistor devices of claim 7, wherein the first set of the plurality of field effect transistor devices includes at least two field effect transistor devices, and the second set of the plurality of field effect transistor devices includes at least two field effect transistor devices.

9. The plurality of field effect transistor devices of claim 8, wherein the first dipole layer is layers are on at least two of the first set of the plurality of field effect transistor devices, and the second dipole layer is on at least two of the second set of the plurality of field effect transistor devices.

10. The plurality of field effect transistor devices of claim 9, wherein one field effect transistor device of the first set of the plurality of field effect transistor devices has a threshold voltage higher than another field effect transistor device of the first set of the plurality of field effect transistor devices.

11. The plurality of field effect transistor devices of claim 9, wherein one of the second set of the plurality of field effect transistor devices has a threshold voltage lower than another of the second set of the plurality of field effect transistor devices.

12. A pair of field effect transistor devices each having a gate structure, comprising:
an interfacial layer on each semiconductor device channel of the pair of field effect transistor devices;
a dipole layer on the interfacial layer on each of the pair of field effect transistor devices;
a gate dielectric layer on the dipole layers;
a first work function layer on a first field effect transistor device of the pair of transistor devices; and
a second work function layer on a second field effect transistor device of the pair of transistor devices.

13. The pair of field effect transistor devices of claim 12, wherein the dipole layer is aluminum oxide (AlO).

14. The pair of field effect transistor devices of claim 12, wherein the second work function layer is also on the first work function layer on the first field effect transistor device.

15. The pair of field effect transistor devices of claim 12, wherein the first field effect transistor device and the second field effect transistor device are both nanosheet type transistor devices.

16. The pair of field effect transistor devices of claim 12, wherein the first field effect transistor device and the second field effect transistor device are both vertical transport field effect transistor devices.

17. The pair of field effect transistor devices of claim 12, wherein the first field effect transistor device is a n-type field effect transistor device and the second field effect transistor device is a p-type field effect transistor devices.

* * * * *